United States Patent [19]

Reed

[11] Patent Number: 4,823,277

[45] Date of Patent: Apr. 18, 1989

[54] FORMING PLATED THROUGH HOLES IN A PRINTED CIRCUIT BOARD BY USING A COMPUTER CONTROLLED PLOTTER

[75] Inventor: Ronald G. Reed, Colorado Springs, Colo.

[73] Assignee: ProtoCAD, Inc., Colorado Springs, Colo.

[21] Appl. No.: 929,390

[22] Filed: Nov. 10, 1986

Related U.S. Application Data

[63] Continuation-in-part of Ser. No. 725,817, Apr. 16, 1985, Pat. No. 4,720,798.

[51] Int. Cl.⁴ ............................................. G05C 9/02
[52] U.S. Cl. ................................. 364/488; 156/901; 156/659.1
[58] Field of Search ............................. 364/488–491, 364/475, 559; 356/399–401; 156/901, 625, 659.1, 645; 318/567; 346/140 R

[56] References Cited

U.S. PATENT DOCUMENTS

| | | | |
|---|---|---|---|
| 3,961,599 | 6/1976 | Jones, Jr. ........................ | 346/140 R |
| 4,400,708 | 8/1983 | Sachs ............................... | 346/140 R |
| 4,485,387 | 11/1984 | Drumheller ......................... | 364/489 |
| 4,588,468 | 5/1986 | McGinty et al. ................... | 156/901 |
| 4,610,756 | 9/1986 | Strobel ............................. | 156/645 |
| 4,692,351 | 9/1987 | Maeda et al. ....................... | 427/196 |

*Primary Examiner*—Parshotam S. Lall
*Assistant Examiner*—Thomas G. Black
*Attorney, Agent, or Firm*—John R. Ley

[57] ABSTRACT

Plated through holes in a printed circuit board can be conveniently produced during manufacture of the circuit board under the control of a computer controlled plotter by the use of a pen-like instrument which positively displaces a thick film fluid conductive adhesive on a tip of the instrument. The fluid is smeared onto the side walls of the hole by moving the tip in a peripheral motion around the side wall of the hole. Copper is electroplated directly onto the conductive adhesive. Resist material is applied in a similar fashion prior to etching the circuit traces on the surface sheets of the circuit board.

25 Claims, 2 Drawing Sheets

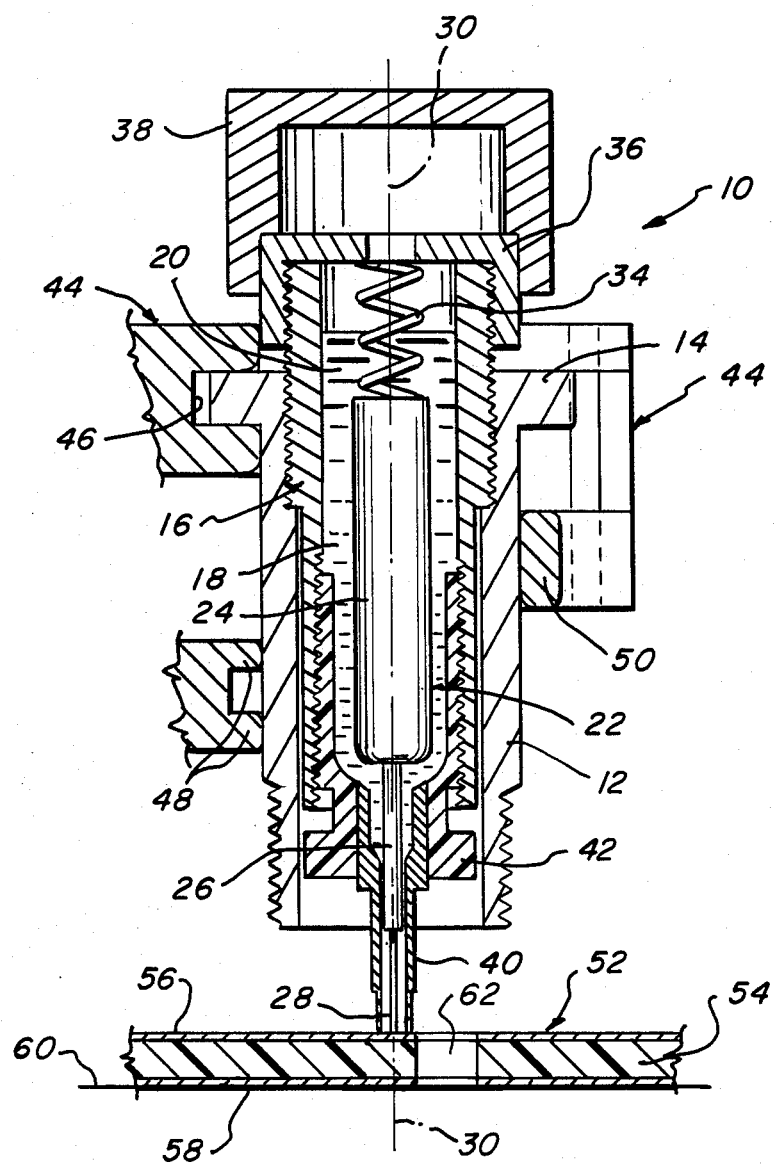
Fig_1

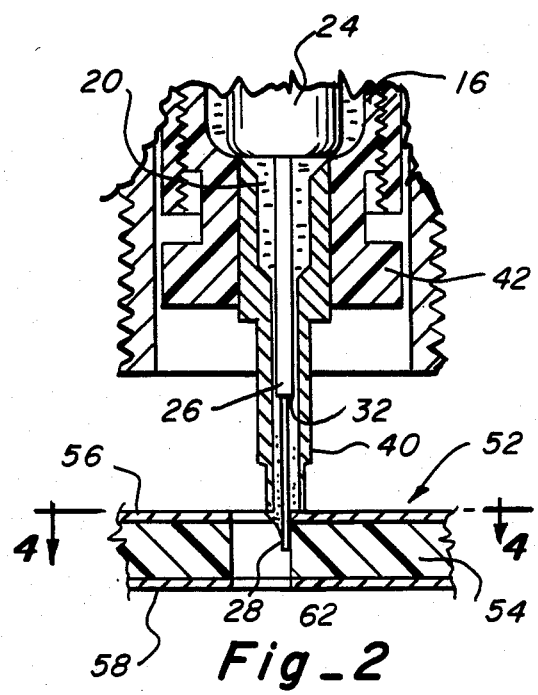
Fig_2
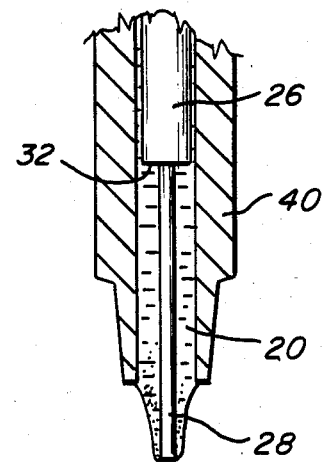
Fig_3
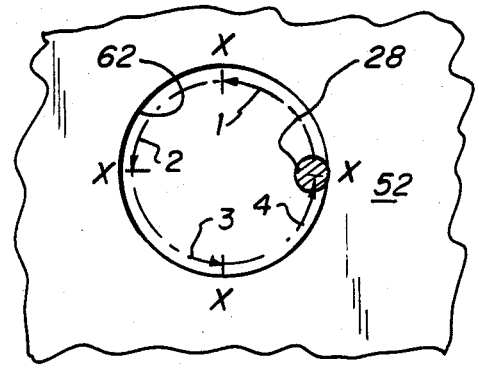
Fig_4

FORMING PLATED THROUGH HOLES IN A PRINTED CIRCUIT BOARD BY USING A COMPUTER CONTROLLED PLOTTER

CROSS-REFERENCE TO RELATED APPLICATIONS

This is a continuation in part of the United States application for "Process for use in Rapidly Producing Printed Circuit Boards Using a Computer Controlled Plotter", Ser. No. 725,817, filed Apr. 16, 1985, now U.S. Pat. No. 4,720,798 and assigned to the assignee hereof. The disclosure of the application Ser. No. 725,817 is incorporated herein by this reference.

The disclosures of related United States patent applications for "Drill Apparatus for use With a Computer Controlled Plotter", Ser. No. 725,415, filed Apr. 16, 1985 now U.S. Pat. No. 4,654,956; and "Optical Sight for Computer Controlled Plotter With Improved Locating Capability", Ser. No. 725,416, filed Apr. 16, 1985 now U.S. Pat. No. 4,654,517, both of which are assigned to the assignee hereof, are also incorporated herein by this reference.

This invention relates to the manufacture of printed circuit boards. More particularly, this invention relates to forming plated through holes in the process of making a printed circuit board. The present invention is particularly useful in a process involving the use of a computer controlled plotter to create the printed circuit board as is described in greater detail in the co-pending related United States applications referenced below.

BACKGROUND OF THE INVENTION

Plated through holes offer a number of desirable features in printed circuit boards, which can be better understood in comparison to printed circuit boards not utilizing plated through holes.

On a single sided printed circuit board, a plated through hole is not necessary because all of the circuit components can be reached to solder the components from the side of the circuit board where the conductor traces are located. With a double sided board where circuit traces are present on both sides, or with boards of sufficient complexity where circuit components are located on both sides of the circuit board, problems are usually encountered when soldering the components to the circuit boards if the circuit board does not have plated through holes. The integrated circuits, resistors, capacitors, and other components are usually so close together that the tip of the soldering iron cannot reach the individual pins or wires of these components to solder them to the traces. An automated soldering machine, such as a wave soldering machine, cannot be used because it will only solder the bottom side of the board and the solder will not reach the top side without plated through holes. A double soldering action is thereby required, either hand soldering the top and then the bottom sides of the board, or wave soldering the bottom and then hand soldering the top. The amount of time it takes to solder the components on the board may be doubled or increased even more without using plated through holes. Human error is likely to occur because it is difficult to see between the components and determine whether they have been properly soldered to the circuit traces on the board. The circuit board itself also becomes very difficult to troubleshoot if there are problems with the electrical connections.

The primary job of a plated through hole in the circuit board is to make a connection at each hole between the circuit pattern on the top side of the board and the circuit pattern on the bottom side of the circuit board. Plated through holes also have the benefit that, when a wire or pin is put down through the hole and soldered, the solder wicks up through the hole, creating a strong solder joint. Plated through holes also allow the components to be attached either by a single soldering operation or by automated soldering if there are no components attached on one side of the board. Plated through holes make it very easy to see whether each pin or wire has been adequately soldered and all the components have been properly mounted and connected.

Plated through holes offer the primary technique by which to connect circuit traces in a multi-layer circuit board. A multi-layer circuit board is one which has been assembled from a plurality of individual circuit boards that have been laminated together by an adhesive. Plated through holes electrically connect the traces on the various circuit boards at the places where connections are required. Plated through holes provide a fairly high degree of confidence that all of the circuit elements on the laminated boards have been connected together in the places where they are required The conventional technique of forming plated through holes on printed circuit boards is a chemical technique which requires many separate chemical baths. Many of these chemical baths are fairly toxic, and the maintenance of all of the baths is capital intensive.

A simple conventional prior art chemical technique of forming plated through holes involves drilling the copper clad board, and thereafter deburring the bottom of the board to remove the metal drillings. The board is then pre-etched, rinsed, and dipped in what is called a hole conditioner which removes any debris from inside the holes and tends to clean the holes. The board is then next rinsed and thereafter dipped in a catalyst or a pre-prep which is a colloidal solution of protective stannic tin around a metallic palladium activator. The colloidal solution of stannic tin/palladium sticks very strongly to the hole walls and not so strongly to the copper layer on the top and bottom of the copper clad board. The board is then next rinsed and thereafter immersed in an activator. The activator strips the tin off of the palladium and makes it very susceptible to copper plating. The board is thereafter rinsed.

The board is next immersed in an electroless copper bath. This bath utilizes the electro-chemical potential between copper sulfate in the bath and palladium. No electricity is needed for the plating. The electroless plating progresses very slowly; for example, it takes about 45 minutes to put approximately 100 micro inches of copper on the inside of the holes. The electroless copper bath also has the disadvantage of being hyper unstable. A small disruption in the chemical content of the bath will make the bath go critical and totally destroy the electro-chemical plating capabilities. An electroless copper bath is fairly difficult to maintain, especially if the bath is being tended to by non-skilled technicians.

After establishing a good electroless coat of copper within the holes, the board is then rinsed and placed into a sulfuric acid etchant. The etchant roughens the copper inside the holes and on the outside of the board. An acidic PH is placed on the surface of the copper. The board is then rinsed. The final step is electroplating. A bath of any of the conventional acid coppers or copper pyrophosphates is established, and an electrical potential and current flow is established between a source of copper (anode) and the circuit board (cathode). The copper is electroplated onto the hole walls and onto the copper surfaces of the outer sheets of the board. After a sufficient thickness of copper has been electroplated in this manner, the board is removed, rinsed and thereafter completed by using the conventional technique of applying resist to the external copper clad layers and on the inside of the plated through holes, and etching away the remaining copper to leave only the conductor traces or patterns on both sides of the circuit board and the plated through holes.

In the prior art technique of forming the plated through holes, the steps up to the electroplating, including the electroless plating, are very difficult and tedious to accomplish. Considerable effort has been directed toward eliminating all of the electroless steps in prior art chemical techniques.

The invention for the "Process for use in Rapidly Producing Printed Circuit Boards Using a Computer Controlled Plotter", referenced above, describes a technique for producing printed circuit boards from copper clad boards by using of a computer controlled plotter, similar to a personal computer plotter, and by use of a simple etchant bath. Since most modern electrical schematic circuit designs are accomplished on computers, and because many computer programs exist for automatically producing printed circuit board design artwork from schematic circuit design information, the previous invention allows design engineers to quickly produce printed circuit boards for testing or for low volume applications. This prior invention did not offer the capability of producing plated through holes quickly and conveniently as a part of the printed circuit board production process. Instead, the plated through holes had to be formed by the conventional procedure of many of the extensive steps described above or with rivets or eyelets. The effect, prior to the present invention, was that the advantage of rapidly producing circuit boards was moderated by the inability to create plated through holes. Resorting to the conventional plate through processes involved encountering the delays and other disadvantages associated with conventional printed circuit board fabrication techniques.

SUMMARY OF THE INVENTION

In general, the present invention involves an instrument and a procedure for smearing a thick film fluid conductive adhesive onto the side wall of a hole in a printed circuit board, in order to produce a printed circuit board having plated through holes by use of a computer controlled plotter, an etchant bath and an electroplating bath. The conductive adhesive is loaded with fine conductive particles. Copper is electroplated directly on to the embedded conductive particles of the conductive adhesive to form the plated through holes. The instrument is also used to apply resist to the inside of the plated through holes to protect the plated through holes when the traces on the circuit board are etched in the etchant bath.

The instrument of the present invention includes means for positively displacing the fluid from within the instrument onto a tip of the instrument. The instrument and the tip are moved, preferably under the control of the plotter, to smear the fluid from the tip onto the side wall of the hole. The positive displacement or pumping action in the instrument is necessary in order to move the relatively high viscosity fluid onto the tip. The pumping action is achieved by moving the instrument to a portion of the circuit board adjacent the hole and moving the instrument into contact with the circuit board. The tip retracts within the interior of the instrument, and when the instrument is lifted from the circuit board, the tip extends and carries with it an amount of fluid which is then used to coat the whole side wall.

The process of coating the side walls involves inserting the tip into the hole, and moving the tip peripherally around the side wall of the hole to smear the fluid onto the side wall from the tip. The tip is of a cross-sectional size substantially less than the area of the hole. The peripheral distance around the side wall of the hole may be divided into segments, and the amount of fluid on the tip is replenished after each segment has been smeared. After the full periphery of the side wall has been smeared, the tip may be moved completely around the side wall in an uninterrupted motion to even the smeared fluid.

In order to form plated through holes, copper is directly electroplated onto the conductive adhesive. All of the involved steps in the chemical process of forming plated through holes in circuit boards prior to electroplating are avoided. The direct electroplating of the copper material allows the plated through holes to be formed as steps in the process of manufacturing the printed circuit board using a computer controlled plotter. The large number of chemical baths in prior processes is eliminated, and in their place, a single electroplating bath is employed.

The present invention can be better understood by the following detailed description of a preferred embodiment of the present invention, which is also illustrated in the accompanying drawings that are briefly described below. Of course, the actual scope of the invention is defined by the appended claims.

BRIEF DESCRIPTION OF THE DRAWINGS

FIG. 1 is a cross-sectional view of the instrument of the present invention taken along an axis thereof, also illustrating a portion of a carrier mechanism of a computer controlled plotter upon which the instrument is retained and a portion of a copper clad board with a hole drilled therethrough.

FIG. 2 is an enlarged portion of the instrument shown in FIG. 1 illustrating a tip of a plunger member of the instrument in an extended position for applying a fluid adhesive onto the wall of the hole through the circuit board.

FIG. 3 is an enlarged view of a portion of the instrument shown in FIG. 2 illustrating the extrusion of the fluid adhesive onto the tip of the instrument as a result of movement of the plunger member.

FIG. 4 is an enlarged top view of the circuit board and instrument tip taken in the plane of line 4—4 of FIG. 2.

DETAILED DESCRIPTION

A presently preferred embodiment of the instrument of the present invention is shown in FIG. 1 and is referenced as 10. The instrument 10 is somewhat similar in overall configuration to a conventional plotter pen for use in a computer controlled plotter.

The instrument 10 includes an outer housing 12 having an annular positioning shoulder 14. An interior tube member 16 is threaded into the housing 12. The tube member 16 has a hollow interior 18 which contains a supply of thick film, thixotropic, vinyl or polymer resinous, fluid, conductive adhesive material 20 which is loaded with very small electrically conductive particles, for example silver or carbon particles of about 5 or less microns in size. The material 20 has the consistency of a very thick or high viscosity fluid.

A plunger member 22 is positioned within the interior 18. The plunger member 22 includes a weight 24 located at its upper end. Extending downwardly from the weight 24 is a shaft 26, and a tip 28 extends from the lower end of the shaft 26. The plunger member 22 and the interior 18 of the instrument 10 are generally concentric about an axis 30 through the instrument. The tip 28 is therefore cylindrical and is of reduced diameter compared to the shaft 26. A step 32 is formed between the shaft 26 and the tip 28 as a consequence of the difference in diameter. The shaft 26 and tip 28 may be formed integrally or the shoulder 32 may be formed by sliding a tube over a wire or other elongated extension having the diameter of the tip 28.

At the upper end of the plunger member 22 a spring 34 extends upwardly and contacts the interior of a cap 36. The cap 36 is threaded onto the upper end of the tube member 16. The spring 34 biases the plunger member 16 downwardly within the interior 18 of the tube member. The hole 38 is formed through the cap 36 for the purpose of loading the interior 18 with the fluid adhesive 20. An outer enclosure 38 is frictionally fitted over the cap 36 in such a manner to form a reservoir for the fluid within the instrument 10.

The shaft 26 and tip 28 of the plunger member 22 move vertically in a reciprocating movement within a lower marking tube 40. The marking tube 40 is attached rigidly and in a fluid tight manner to a plug member 42. The plug member 42 is threaded into the lower end of the tube member 16.

The instrument 10 is held or maintained on a carrier assembly 44 of a conventional computer controlled plotter (not shown). The instrument 10 is maintained in a fixed position on the carrier assembly 44 as a result of the annular shoulder 14 being received within a groove 46 in the carrier assembly 44, a ridge support 48 of the carrier assembly 44 resting against the outer housing 12, and a lever 50 of the carrier assembly 44 applying force to hold the instrument 10 in position. When retained in position on the carrier assembly, the axis 30 of the instrument 10 is coincident with a reference axis of the carrier assembly 44. In this manner, the computer can control the exact location of the tip 28 relative to a printed circuit board or a copper clad board 52 from which the printed circuit board is produced.

The copper clad board 52 has a layer of insulating material 54, such as a layer of non-conductive fiberglass. Attached to the top surface of the insulating layer 52 is an upper sheet 56 or layer of copper, and a lower sheet 58 or layer of copper. The copper clad board 52 is resting on the upper surface of a thin sheet of material represented at 60 by which the position of the copper clad board can be manipulated as a result of conventional plotter movement.

As is shown in FIGS. 1 and 2, a hole 62 is formed through the copper clad board 52. The hole 62 exposes the non-conductive fiberglass of the insulating material 54 between the sheets 56 and 58.

The spring 34 normally biases the plunger member 22 to the downward position illustrated in FIG. 2. To reciprocate the plunger member 22, the carrier assembly 44 moves the instrument 10 to a location laterally with the upper surface displaced from the hole 62 and moves the instrument 10 downward into weighted contact with the upper surface the board 52, as is shown in FIG. 1. The tip 28 contacts the upper sheet 56 of the board 52 at a position laterally displaced from a hole 62, as is illustrated by one of the Xs shown in FIG. 4. The carrier assembly 44 moves the instrument 10 downward, and the plunger member 22 remains stationary as the remaining portions of the instrument 10 continue to move downwardly. The lower most end of the marking tube 40 contacts the upper sheet 56, as is shown in FIG. 1. The carrier assembly thereafter lifts the instrument upwardly away from the board 52, and the spring 34 pushes the plunger member, shaft and tip downward. Reciprocation movement of the shaft, tip and the plunger member is thereby achieved relative to the tube 40. The tip moves between a retracted position wherein it is withdrawn into the tube (FIG. 1) to an extended position wherein it extends beyond the terminal end of the tube 40 (FIGS. 2 and 3).

The shoulder 32 and the relative reciprocation movement of the plunger member 22 within the instrument 10 have the desirable effect of positively extruding or pumping the fluid conductive adhesive onto the tip 28. When the instrument 10 is moved upward from the position shown in FIG. 1 the spring 34 pushes the plunger member 22 downward. The downward movement of the plunger assembly forces the shoulder 32 to extrude the fluid material downward on and surrounding the tip 28. The shoulder 32 is therefore one example of means for positively displacing the fluid within the tube 40 onto the tip 28, as a result of the reciprocative movement from the retracted to the extended position.

The positive pumping action is very important because the conductive adhesive 20 has a very high viscosity and is relatively thixotropic. As compared to the normal ink in a plotter marking pen which moves downward in sufficient quantities by capillary action to a marking tip of the pen (somewhat similar to the tip 28), the fluid adhesive 20 will not flow in sufficient amounts by capillary action to maintain an adequate supply on the tip 28. However, capillary action does appear to fill the interior of the marking tube 40 surrounding the tip 28, so that upon the relative downward movement of the plunger member 22, the fluid adhesive 20 is coated onto the exposed tip 28 as is shown in FIG. 3.

By displacing the conductive adhesive onto the tip 28, a sufficient amount of the fluid is assured for coating or smearing the wall of the hole 62. One advantageous approach to assuring a sufficient supply of adhesive material to adequately coat the hole side wall is to divide the periphery or circumference of the hole 62 into a plurality of segments, such as the four segments numbered 1 to 4 shown in FIG. 4. Each of the segments is separately smeared with the fluid adhesive. The instrument 10 is moved to the locations indicated by the Xs shown in FIG. 4 and a pumping or reciprocating action described above is accomplished at each X so that a sufficient supply of the conductive adhesive is available to coat each of the segments of the hole 62. Coating hole walls starts by moving the instrument with the tip 28 extended into the hole. The cylindrical surface of the tip 28 is moved into contact with the curved sidewall of the hole 62. The tip is then moved peripherally around the side wall of the hole. Moving the instrument is accomplished under the control of the computer which moves the carrier assembly 44 (FIG. 1). After the segments of the hole wall are smeared with the fluid, the tip 28 is moved in at least one complete uninterrupted motion around the circumference of the hole 62 to evenly distribute the smeared fluid adhesive.

The tip 28 extends below the lower or terminal end of the marking tube 40 a predetermined distance. The predetermined distance may be approximately the thickness of the circuit board. The length of the tip will thus allow the hole wall to be completely coated by operating on the circuit board from one side of the board. Coating small hole walls in this manner has proved satisfactory. Coating large holes is better accomplished by using a tip length wherein the predetermined distance is slightly greater than one-half of the vertical thickness of the board 52 (FIG. 2). Each of the holes 62 in the board 52 is thus coated on the upper vertical half thereof with the conductive adhesive in the manner described. Thereafter, the board 52 is removed from the plotter and turned over. Under computer control, the instrument 10 is moved to coat the other half of each of the holes. In this manner larger holes are completely smeared with the conductive adhesive from one sheet 56 of the board to the other sheet 58 (FIG. 2).

After the conductive adhesive has been smeared on all of the holes in the circuit board in the manner described, the conductive adhesive is cured. Excess conductive adhesive is removed from the surfaces of the sheets 56 and 58 of the board 52, leaving the cured conductive adhesive only on the side wall of the hole. The copper clad board is thereafter directly electroplated in an electroplating bath. The conductive adhesive forms a basis for the electrodeposition of copper in each of the holes and causes the deposited copper to stick to the insulating material of the board.

By utilizing the technique described above, the formation of plated through holes is greatly simplified, compared to the prior art chemical process of doing so, because all of the steps prior to and including the electroless deposition are eliminated. By eliminating those steps, the problems and disadvantages of maintaining all of the separate chemical baths and the criticality of those baths is likewise eliminated. The technique of the present invention allows a person unfamiliar with chemical processes to completely produce a printed circuit board with plated through holes simply by using the technique described above and in the previously described applications assigned to the assignee hereof, and by use only of an electroplating bath and an etchant bath. The process is greatly simplified, and most of the risks associated with maintaining multiple chemical baths are totally eliminated.

In addition to smearing the walls of the holes with a conductive adhesive, the instrument 10 is also used to apply a fluid resist material to the plated through holes prior to etching the circuit traces from the conductive layers on the circuit board. The resist is applied in the same manner as has been described for coating the sidewall of the hole. The resist material is loaded into the instrument 10 and takes the place of the conductive adhesive 20 described above.

The thick film, thixotropic, fluid conductive adhesive material which has proved satisfactory for use in the present invention is a No. 416 silver ink manufactured by Acheson-Colloids. The properties of this ink are improved if it is dilluted by one part isopropyl alcohol to two parts of this type of ink. Other types of vinyl, polymer or resin fluid adhesives which are loaded with small particles of an electrical conductor, such as carbon or silver, in the range of less than 5 micron size, can also be employed with the present invention.

A preferred embodiment of the present invention has been described with a degree of particularity. However, this detailed description has been made by way of preferred example. The scope of the invention is defined by the appended claims.

What is claimed is:

1. An instrument for applying a relatively high viscosity fluid onto the wall of a hole formed in a layer of material, comprising:
   a member having a tube extending therefrom which terminates at a terminal end, the member also defining a hollow interior within which to contain the fluid;
   a plunger member positioned substantially within the interior and comprising a shaft and a tip extending from the shaft, the tip and the shaft extending into the tube;
   the tube slideably retaining the tip and the shaft for reciprocative movement along a predetermined axis between an extended position wherein the tip extends beyond the terminal end of the tube and a retracted position wherein the tip withdraws to within the tube; and
   means connected to and moving with the shaft and the tip for positively displaying fluid from within the tube onto the tip upon movement of the shaft and tip from the retracted position to the extended position.

2. An instrument as defined in claim 1 wherein said means for positively displacing the fluid comprises a shoulder formed on the tip.

3. An instrument as defined in claim 1 wherein the tip and the shaft are cyclindrical about the axis, and the tip is of lesser diameter than the shaft.

4. An instrument as defined in claim 3 wherein the means for positively displacing the fluid is located between the shaft and the tip.

5. An instrument as defined in claim 4 wherein the means for positively displacing the fluid comprises a shoulder formed at the junction of the tip and the shaft, the shoulder resulting from the difference in diameters of the tip and the shaft.

6. An instrument as defined in claim 1 further comprising a weight attached to the plunger member.

7. An instrument as defined in claim 1 wherein the plunger member moves reciprocatively in unison with the tip and shaft, and further comprising means for biasing the plunger member for movement toward the extended position.

8. A process of coating each side wall of a hole formed in a layer of material with a relatively high viscosity fluid which contains electrically conductive particles upon which a layer of metal can be substantially evenly electroplated to form a plated through hole in the layer of material, comprising the steps of:
   positively displacing a quantity of the fluid onto a tip of an instrument, the tip having a curved exterior surface and a cross-sectional size substantially less than the area of the hole;
   inserting the tip into the hole; and
   moving the tip peripherally around the side wall of the hole to smear a substantially even coating of the fluid onto the side wall from the tip.

9. A process as defined in claim 8 further comprising:
   replenishing the quantity of fluid on the tip prior to completely coating the side wall of the hole by accomplishing the aforesaid steps to coat each of a plurality of segments of the side wall of the hole.

10. A process as defined in claim 9 further comprising moving the tip in an uninterrupted motion around the side wall to evenly distribute the fluid after all the segments of the side wall have been coated.

11. A process as defined in claim 9 further comprising:
movably retaining the tip within a tube of an instrument for reciprocative movement between an extended position wherein the tip extends beyond a terminal end of the tube and a retracted position wherein the tip withdraws to within the tube;
biasing the tip to move the tip toward the extended position; and
wherein the step of replenishing the quantity of fluid on the tip comprises:
displacing the fluid onto the tip upon movement of the tip from the retracted position to the extended position;
contacting the tip on the material at a position outside of the hole;
moving the instrument toward the material to position the tip in the retracted position; and
removing the instrument away from the material to allow the tip to move to the extended position.

12. A process as defined in claim 8 further comprising:
movably retaining the tip within a tube of an instrument for reciprocative movement between an extended position when the tip extends beyond a terminal end of the tube and a retracted position wherein the tip withdraws to within the tube;
biasing the tip to move the tip toward the extended position;
displacing the fluid onto the tip upon movement of the tip from the retracted position to the extended position;
contacting the tip on the material at a position outside of the hole;
moving the instrument toward the material to position the tip in the retracted position;
removing the instrument away from the material to allow the tip to move to the extended position; and
coating the side wall of the hole with the tip in the extended position.

13. A process as defined in claim 12 further comprising:
coating a plurality of segments of the side wall of the hole by accomplishing the aforesaid steps for each such segment, a plurality of segments extending around the complete periphery of the hole.

14. A process as defined in claim 13 further comprising:
moving the tip completely around the side wall of the hole to evenly distribute the fluid after all segments of the side wall have been coated.

15. A process as defined in claim 14 further comprising:
accomplishing the aforesaid steps under the control of a computer which operates a plotter.

16. A process of forming plated through holes between copper surface conductors on opposite sides of a non-conductive substrate of a printed circuit board, comprising the steps of:
coating a rounded tip of an instrument with a quantity of thick film adhesive loaded with conductive particles,
inserting the rounded tip into the hole, the cross-sectional size of the tip being substantially less than area of the hole,
moving the rounded tip into contact with and along the periphery of the side wall of the hole to smear the adhesive onto the side wall, and
electroplating copper onto the conductive particles and between the copper conductive surfaces on opposite sides of the board.

17. A process as defined in claim 16 further comprising the steps of:
dividing the peripheral distance around the side wall of the hole into a plurality of segments, and
performing the tip coating, inserting and moving steps recited in claim 16 at least once for each segment of the peripheral distance around the wall of the hole, prior to electroplating copper onto the adhesive.

18. A process as defined in claim 17 wherein the step of coating the tip comprises:
pumping the adhesive onto the tip.

19. A process as defined in claim 16 wherein the thick film adhesive comprises a resinous compound loaded with particles of a conductive material.

20. A process as defined in claim 19 wherein the particles of the conductive material are in the size range of less than five microns.

21. A process of coating each side wall of a hole formed in a layer of material with a relatively high viscosity fluid, comprising the steps of:
movably retaining a tip within a tube of an instrument for reciprocative movement between an extended position wherein the tip extends beyond a terminal end of the tube and a retracted position wherein the tip withdraws to within the tube;
biasing the tip to move the tip toward the extended position;
positively displacing a quantity of the fluid onto the tip, the tip having a curved exterior surface and a cross-sectional size substantially less than the area of the hole;
inserting the tip into the hole;
moving the tip peripherally around the side wall of the hole to smear the fluid onto the side wall from the tip;
replenishing the quantity of fluid on the tip prior to completely coating each side wall of the hole by accomplishing the steps of positively displacing a quantity of the fluid, inserting the tip, and moving the tip peripherally to coat each of a plurality of segments of the side wall of the hole, said replenishing step comprising:
contacting the tip on the material at a position outside of the hole;
moving the instrument toward the material to position the tip in the retracted position;
removing the instrument away from the material to allow the tip to move to the extended position; and
displacing the fluid onto the tip upon movement of the tip from the retracted position to the extended position.

22. A process of coating each side wall of a hole formed in a layer of material with a relatively high viscosity fluid, comprising the steps of:
movably retaining a tip within a tube of an instrument for reciprocative movement between an extended position wherein the tip extends beyond a terminal end of the tube and a retracted position wherein the tip withdraws to within the tube;

biasing the tip to move the tip toward the extended position;

positively displacing a quantity of the fluid onto the tip, the tip having a curved exterior surface and a cross-sectional size substantially less than the area of the hole;

inserting the tip into the hole;

moving the tip peripherally around the side wall of the hole to smear the fluid onto the side wall from the tip;

contacting the tip on the material at a position outside of the hole;

moving the instrument toward the material to position the tip in the retracted position;

removing the instrument away from the material to allow the tip to move to the extended position;

displacing the fluid onto the tip upon movement of the tip from the retracted position to the extended position; and coating the side wall of the hole with the tip in the extended position.

23. A process as defined in claim 22 further comprising:

coating a plurality of segments of the side wall of the hole by accomplishing the aforesaid steps for each such segment, a plurality of segments extending around the complete periphery of the hole.

24. A process as defined in claim 23 further comprising:

moving the tip completely around the side wall of the hole to evenly distribute the fluid after all segments of the side wall have been coated.

25. A process as defined in claim 24 further comprising:

accomplishing the aforesaid steps under the control of a computer which operates a plotter.

* * * * *